United States Patent
Lee et al.

(10) Patent No.: US 8,729,797 B2
(45) Date of Patent: May 20, 2014

(54) ORGANIC LIGHT EMITTING DIODE DISPLAY AND MANUFACTURING METHOD THEREOF

(75) Inventors: So-Young Lee, Yongin (KR);
Yoon-Hyeung Cho, Yongin (KR);
Min-Ho Oh, Yongin (KR); Byoung-Duk Lee, Yongin (KR); Yong-Tak Kim, Yongin (KR); Sang-Hwan Cho, Yongin (KR); Yun-Ah Chung, Yongin (KR); Seung-Yong Song, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 349 days.

(21) Appl. No.: 13/302,321

(22) Filed: Nov. 22, 2011

(65) Prior Publication Data
US 2012/0256534 A1 Oct. 11, 2012

(30) Foreign Application Priority Data
Apr. 11, 2011 (KR) ........................ 10-2011-0033397

(51) Int. Cl.
*H01L 51/50* (2006.01)
*B32B 38/00* (2006.01)

(52) U.S. Cl.
USPC .............................. 313/512; 445/25; 156/247

(58) Field of Classification Search
USPC ..................... 313/504, 512; 445/25; 156/247
See application file for complete search history.

(56) References Cited

U.S. PATENT DOCUMENTS

2012/0043126 A1* 2/2012 Hong et al. .................. 174/259

FOREIGN PATENT DOCUMENTS

| KR | 10-2006-0020051 | 3/2006 |
| KR | 10-2007-0060689 | 6/2007 |
| KR | 10-2010-0019650 | 2/2010 |
| KR | 2010110173 A * | 10/2010 |

OTHER PUBLICATIONS

Kim, In Beom, et al., "Adhesive and Removable Characteristics of UV Curable Adhesive", Korean Chem. Eng. Res., vol. 46, No. 1, Feb. 2008, pp. 76-81.

* cited by examiner

*Primary Examiner* — Karabi Guharay
(74) *Attorney, Agent, or Firm* — Christie, Parker & Hale, LLP

(57) ABSTRACT

A manufacturing method of an OLED display is provided. The method includes: forming an organic emission layer and a thin film encapsulation layer covering the organic emission layer on a substrate including a pixel area and a peripheral area; adhering a laminating film including a plurality of adhesive layers and an upper protective layer that covers an upper adhesive layer from among the adhesive layers on the thin film encapsulation layer, a lower adhesive layer from among the adhesive layers contacting the thin film encapsulation layer; radiating UV light on the laminating film that corresponds to the peripheral area of the substrate to decrease adhesion between the lower adhesive layer and the thin film encapsulation layer corresponding to the peripheral area; and peeling the laminating film corresponding to the peripheral area from the thin film encapsulation layer to maintain the laminating film that corresponds to the pixel area.

19 Claims, 11 Drawing Sheets

ORGANIC LIGHT EMITTING DIODE DISPLAY AND MANUFACTURING METHOD THEREOF

CROSS-REFERENCE TO RELATED APPLICATIONS

This application claims priority to and the benefit of Korean Patent Application No. 10-2011-0033397, filed in the Korean Intellectual Property Office on Apr. 11, 2011, the entire content of which is incorporated herein by reference.

BACKGROUND

1. Field

Aspects of embodiments of the present invention relate generally to an organic light emitting diode (OLED) display and a manufacturing method thereof.

2. Description of the Related Art

An organic light emitting diode (OLED) display includes two electrodes and an organic emission layer disposed between the two electrodes. Electrons injected from one electrode and holes injected from the other electrode are coupled with each other in the organic emission layer to form excitons. The excitons emit light while passing from an excited state to a ground state.

In order to protect such an OLED display, a laminating film may be formed on a surface of the OLED display. The laminating film may require a laminating film patterning process because the laminating film should not be formed on a pad formed in a peripheral area of the OLED display. The laminating film patterning process may be performed, for example, using a photolithography process, a laser cutting process, or a press process.

However, the photolithography process may cause damage to the OLED display under the laminating film. In addition, in the laser cutting process or the press process, the laminating film should be processed using an additional cutting or press device before attaching the laminating film to the OLED display. This can lead to increased process time and cost. Further, when using such laminating film pattering processes, a pattern change due to a model change of the OLED display cannot be easily performed.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention relate to an organic light emitting diode (OLED) display that can be manufactured through a simple process while reducing cost, and a manufacturing method thereof.

In an exemplary embodiment according to the present invention, an organic light emitting diode (OLED) display is disclosed. The OLED display includes an organic emission layer on a substrate including a pixel area and a peripheral area, a thin film encapsulation layer covering the organic emission layer corresponding to the pixel area of the substrate; and a pixel laminating film covering the thin film encapsulation layer corresponding to the pixel area of the substrate. The pixel laminating film includes one or more pixel adhesive layers that each comprise an acryl-based adhesive, a di-functional ultraviolet (UV) oligomer, and a hexa-functional UV oligomer.

An upper pixel adhesive layer and a lower pixel adhesive layer from among the pixel adhesive layers may have different di-functional UV oligomer concentrations and different hexa-functional UV oligomer concentrations.

A di-functional UV oligomer concentration of the upper pixel adhesive layer may be larger than a di-functional UV oligomer concentration of the lower pixel adhesive layer.

A sum of the di-functional UV oligomer concentration and a hexa-functional UV oligomer concentration of the upper pixel adhesive layer may be less than a sum of the di-functional UV oligomer concentration and a hexa-functional UV oligomer concentration of the lower pixel adhesive layer.

The thin film encapsulation layer may correspond to the pixel area of the substrate, and may include the di-functional UV oligomer and the hexa-functional UV oligomer.

An upper pixel adhesive layer from among the pixel adhesive layers and the thin film encapsulation layer may have different di-functional UV oligomer concentrations and different hexa-functional UV oligomer concentrations.

A di-functional UV oligomer concentration of the thin film encapsulation layer is less than a di-functional UV oligomer concentration of the upper pixel adhesive layer.

A sum of the di-functional UV oligomer concentration and a hexa-functional UV oligomer concentration of the thin film encapsulation layer may be larger than a sum of the di-functional UV oligomer concentration and a hexa-functional UV oligomer concentration of the upper pixel adhesive layer.

According to another exemplary embodiment of the present invention, a manufacturing method of an organic light emitting diode (OLED) display is disclosed. The method includes: forming an organic emission layer and a thin film encapsulation layer covering the organic emission layer on a substrate including a pixel area and a peripheral area; adhering a laminating film comprising a plurality of adhesive layers and an upper protective layer that covers an upper adhesive layer from among the plurality of adhesive layers on the thin film encapsulation layer, a lower adhesive layer from among the plurality of adhesive layers contacting the thin film encapsulation layer; radiating ultraviolet (UV) light on the laminating film that corresponds to the peripheral area of the substrate to decrease adhesion between the lower adhesive layer and the thin film encapsulation layer corresponding to the peripheral area of the substrate; and peeling the laminating film corresponding to the peripheral area of the substrate from the thin film encapsulation layer to maintain the laminating film that corresponds to the pixel area of the substrate.

Each of the plurality of adhesive layers may contain an acryl-based adhesive, a di-functional UV oligomer, and a hexa-functional UV oligomer.

A di-functional UV oligomer concentration of the upper adhesive layer may be larger than a di-functional UV oligomer concentration of the lower adhesive layer.

A sum of the di-functional UV oligomer concentration and a hexa-functional UV oligomer concentration of the upper adhesive layer may be less than a sum of the di-functional UV oligomer concentration and a hexa-functional UV oligomer concentration of the lower adhesive layer.

The peeling of the laminating film corresponding to the peripheral area of the substrate may include peeling the upper protective layer that corresponds to the pixel area of the substrate from the upper adhesive layer.

The method may further include curing the laminating film that corresponds to the pixel area of the substrate after the peeling of the laminating film corresponding to the peripheral area of the substrate.

According to yet another exemplary embodiment of the present invention, a manufacturing method of an organic light emitting diode (OLED) display is provided. The method includes: forming an organic emission layer and a thin film encapsulation layer that covers the organic emission layer and contains a di-functional ultraviolet (UV) oligomer and a hexa-functional UV oligomer on a substrate including a pixel area and a peripheral area; adhering a laminating film comprising one or more adhesive layers and an upper protective layer covering an upper adhesive layer from among the adhesive layers on the thin film encapsulation layer; radiating ultraviolet (UV) light on the laminating film and the thin film encapsulation layer that corresponds to the peripheral area of the substrate to decrease adhesion between the thin film encapsulation layer and the organic emission layer corresponding to the peripheral area of the substrate; and peeling the laminating film and the thin film encapsulation layer corresponding to the peripheral area of the substrate from the organic emission layer to maintain the laminating film and the thin film encapsulation layer corresponding to the pixel area of the substrate.

Each of the adhesive layers may contain an acryl-based adhesive, a di-functional UV oligomer, and a hexa-functional UV oligomer.

A di-functional UV oligomer concentration of the thin film encapsulation layer may be less than a di-functional UV oligomer concentration of the upper adhesive layer.

A sum of the di-functional UV oligomer concentration and a hexa-functional UV oligomer concentration of the thin film encapsulation layer may be larger than a sum of the di-functional UV oligomer concentration and a hexa-functional UV oligomer concentration of the upper adhesive layer.

The peeling of the laminating film and the thin film encapsulation layer corresponding to the peripheral area of the substrate may include peeling the upper protective layer that corresponds to the pixel area of the substrate from the upper adhesive layer.

The method may further include curing the laminating film that corresponds to the pixel area of the substrate after the peeling of the laminating film and the thin film encapsulation layer corresponding to the peripheral area of the substrate.

According to exemplary embodiments of the present invention as discussed above, a pattern change of the laminating film due to a model change of the OLED display can be easily performed through such a laminating film patterning process. Further, since no additional cutting device or press device is required, the process time can be shortened and the process cost can be reduced.

DETAILED DESCRIPTION

Figure 1:
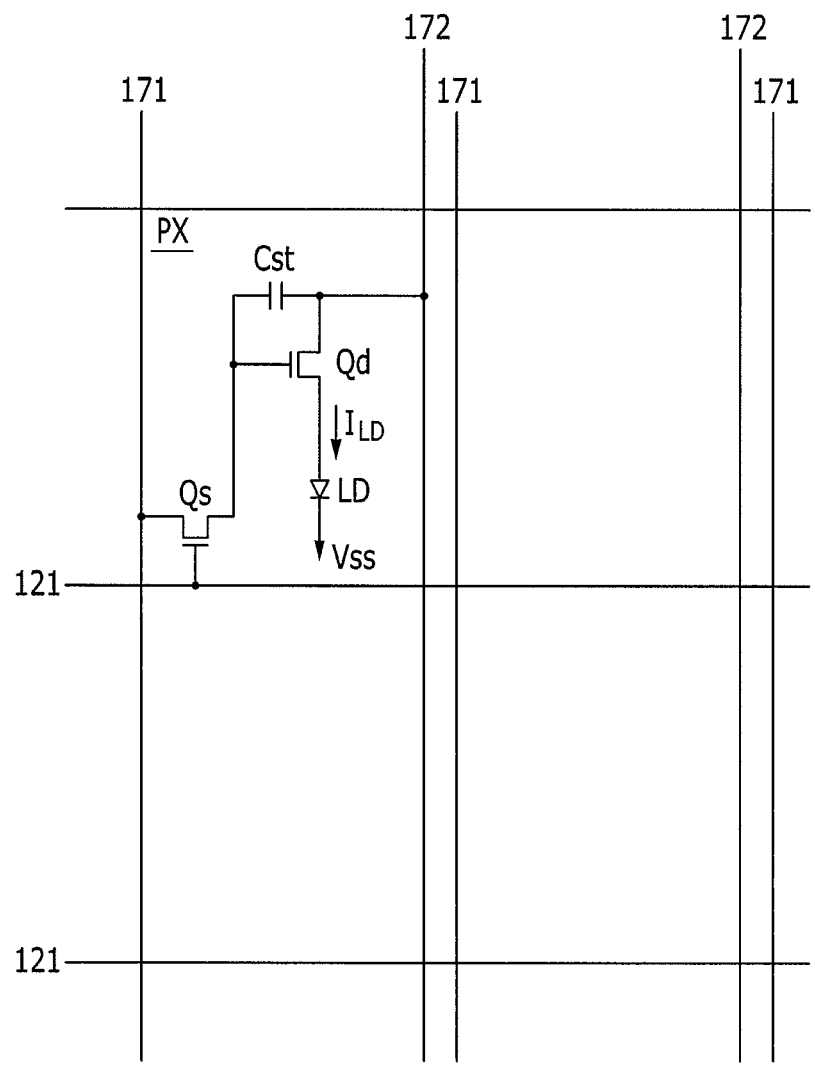
FIG. 1 is an equivalent circuit diagram of an organic light emitting diode (OLED) display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the description, some of the parts that are not relevant are omitted, and like reference numerals designate like elements throughout the specification. In addition, the size and thickness of each component shown in the drawings are for ease of understanding and description, but the present invention is not limited thereto.

Figure 2:
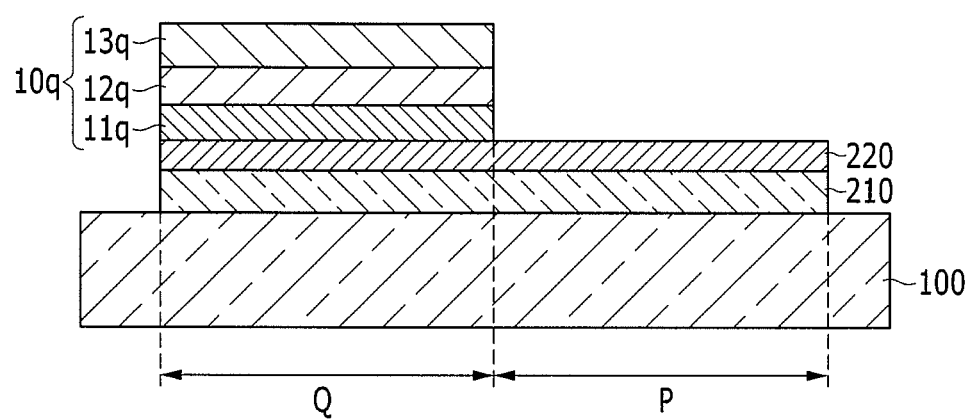
FIG. 2 is a cross-sectional view of the OLED display of FIG. 1.

Referring to FIGS. 1-2, an organic light emitting diode (OLED) display according to a first exemplary embodiment will be described in detail. FIG. 1 is an equivalent circuit diagram of the OLED display, and FIG. 2 is a cross-sectional view of the OLED display.

As shown in FIG. 1, the OLED display includes a plurality of signal lines 121, 171, and 172, and a plurality of pixels PX connected to the plurality of signal lines and substantially arranged in a matrix format. The signal lines 121, 171, and 172 include a plurality of gate lines 121 for transmitting a gate signal (or scan signal), a plurality of data lines 171 for transmitting a data signal, and a plurality of driving voltage lines 172 for transmitting a driving voltage. The gate lines 121 are extended in a row direction and are substantially parallel with each other, and the data lines 171 and the driving voltage lines 172 are substantially arranged in a column direction and are substantially parallel with each other.

Each pixel PX includes a switching thin film transistor Qs, a driving thin film transistor Qd, a storage capacitor Cst, and an organic light emitting diode (OLED) LD. The switching thin film transistor Qs includes a control terminal, an input terminal, and an output terminal. The control terminal is connected to the gate line 121, the input terminal is connected to the data line 171, and the output terminal is connected to the driving thin film transistor Qd. The switching thin film transistor Qs transmits a data signal applied to the data line 171 to the driving thin film transistor Qd in response to a scan signal applied to the gate line 121.

The driving thin film transistor Qd includes a control terminal, an input terminal, and an output terminal. The control terminal is connected to the switching thin film transistor Qs, the input terminal is connected to the driving voltage line 172, and the output terminal is connected to the OLED LD. The driving thin film transistor Qd flows an output current $I_{LD}$ whose magnitude varies depending on a voltage between the control terminal and the output terminal thereof.

The storage capacitor Cst is connected between the control terminal and the input terminal of the driving thin film transistor Qd. The storage capacitor Cst charges the data signal applied to the control terminal of the driving thin film transistor Qd and maintains the charge of the data signal after the switching thin film transistor Qs is turned off.

The OLED LD includes an anode connected to the output terminal of the driving thin film transistor Qd and a cathode connected to a common voltage Vss. The OLED LD emits light that is varied in intensity depending on the output current $I_{LD}$ of the thin film transistor Qd to display an image.

In FIG. 1, the switching thin film transistor Qs and the driving thin film transistor Qd are depicted as n-channel field effect transistors (FETs). However, in other embodiments, at least one of the switching thin film transistor Qs or the driving thin film transistor Qd may be a p-channel field effect transistor. Further, in other embodiments, the connection relationship among the thin film transistors Qs and Qd, the storage capacitor Cst, and the OLED LD may vary.

A structure of the OLED display of FIG. 1 will now be described in further detail with reference to FIGS. 1-2.

As shown in FIG. 2, an organic emission layer 210 is disposed on a substrate 100 including a pixel area Q and a peripheral area P. The organic emission layer 210 includes the switching thin film transistor Qs, the driving thin film transistor Qd, and the OLED LD (including the anode connected to the output terminal of the driving thin film transistor Qd, and the cathode connected to the common voltage Vss).

A thin film encapsulation layer 220 is disposed on the organic emission layer 210 to encapsulate the organic emission layer 210 by covering the same. A pixel laminating film 10q is disposed on a pixel area Q of the thin film encapsulation layer 220. Here, the pixel area Q of the thin film encapsulation layer 220 corresponds to the pixel area Q of the substrate 100. The pixel laminating film 10q includes a plurality of pixel adhesive layers 11q, 12q, and 13q, each of which may contain an acryl-based adhesive, a di-functional ultraviolet (UV) oligomer, and a hexa-functional UV oligomer. In the first exemplary embodiment shown in FIG. 2, three pixel adhesive layers 11q, 12q, and 13q are exemplarily illustrated, but in other embodiments, four or more pixel adhesive layers may be provided, while in still other embodiments, two pixel adhesive layers may be provided.

The plurality of pixel adhesive layers 11q, 12q, and 13q are cured such that they protect the OLED display from the external environment. The plurality of pixel adhesive layers 11q, 12q, and 13q includes a lower pixel adhesive layer 11q, a middle pixel adhesive layer 12q, and an upper pixel adhesive layer 13q. The lower pixel adhesive layer 11q directly contacts the thin film encapsulation layer 220.

The upper pixel adhesive layer 13q and the lower pixel adhesive layer 11q are different from each other in the concentration (content) of the di-functional UV oligomer and the concentration (content) of the hexa-functional UV oligomer. That is, the upper pixel adhesive layer 13q contains much more di-functional UV oligomer than the lower pixel adhesive layer 11q, and the sum of the di-functional UV oligomer concentration and the hexa-functional UV oligomer concentration of the upper pixel adhesive layer 13q is less than the sum of the di-functional UV oligomer concentration and the hexa-functional UV oligomer concentration of the lower pixel adhesive layer 11q. The same relationship may exist with the other pixel adhesive layers (for example, the middle pixel adhesive layer 12q) and the lower pixel adhesive layer 11q.

In this case, the di-functional UV oligomer has a stronger adhesive force than the hexa-functional UV oligomer, and the adhesive force is increased as the sum of the di-functional UV oligomer concentration and the hexa-functional UV oligomer concentration is decreased (for example, as the concentration of hexa-functional UV oligomer is decreased). Thus, when UV light is radiated to a peripheral laminating film 10p (refer to FIG. 5) disposed in the peripheral area P to manufacture the OLED display of FIGS. 1-2, the adhesive force of a lower peripheral adhesive layer 11p containing much more of the hexa-functional UV oligomer than the di-functional UV oligomer (relative to those of upper peripheral adhesive layer 13p) is weakened because the adhesive force of the hexa-functional UV oligomer becomes weaker (e.g., significantly weaker) after the UV light irradiation compared to that of the di-functional UV oligomer. Accordingly, the lower peripheral adhesive layer 11p disposed in the peripheral area P can be easily peeled from the thin film encapsulation layer 220.

Figure 3:
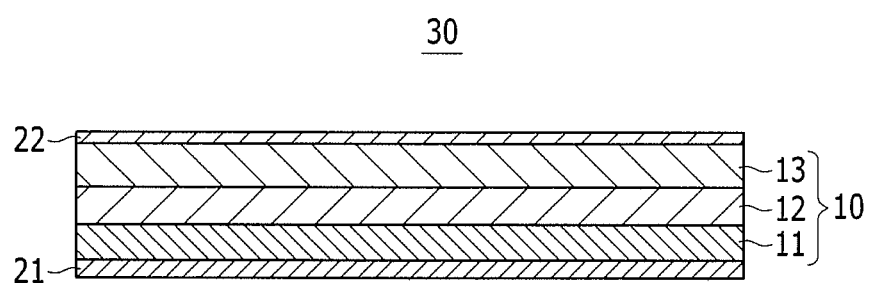
FIG. 3 is a cross-sectional view of a laminating film covering the OLED display of FIGS. 1-2.

The manufacturing method of the OLED display according to the first exemplary embodiment will now be described in further detail with reference to FIGS. 3-6. FIG. 3 is a cross-sectional view of a laminating film of the OLED display of FIGS. 1-2, and FIGS. 4-6 are cross-sectional views illustrating a manufacturing method of the OLED display of FIGS. 1-3.

First, as shown in FIG. 3, a laminating film 30 that includes an adhesive layer 10, an upper protective layer 22, and a lower protective layer 21 is provided. The adhesive layer 10 includes a lower adhesive layer 11, a middle adhesive layer 12, and an upper adhesive layer 13. The upper protective layer 22 covers the upper adhesive layer 13, and the lower protective layer 21 covers the lower adhesive layer 11. The adhesive layer 10 (for example, each of the lower adhesive layer 11, middle adhesive layer 12, and upper adhesive layer 13) contains an acryl-based adhesive, a di-functional UV oligomer, and a hexa-functional UV oligomer.

Figure 4:
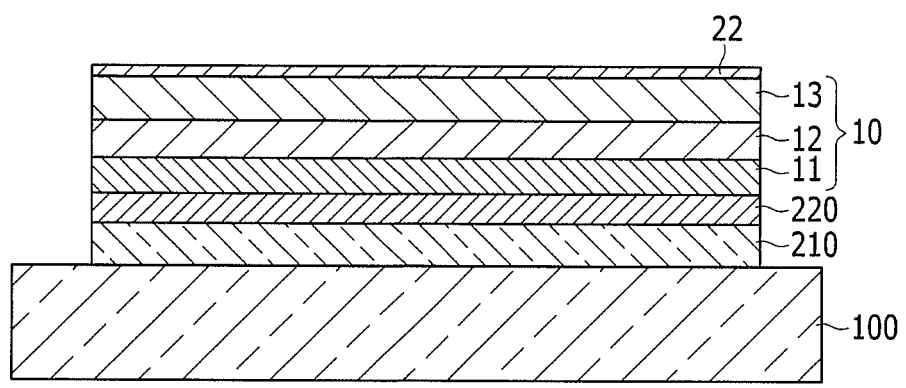
FIGS. 4-6 are cross-sectional views of a manufacturing method of the OLED display of FIGS. 1-3.
Figure 6:
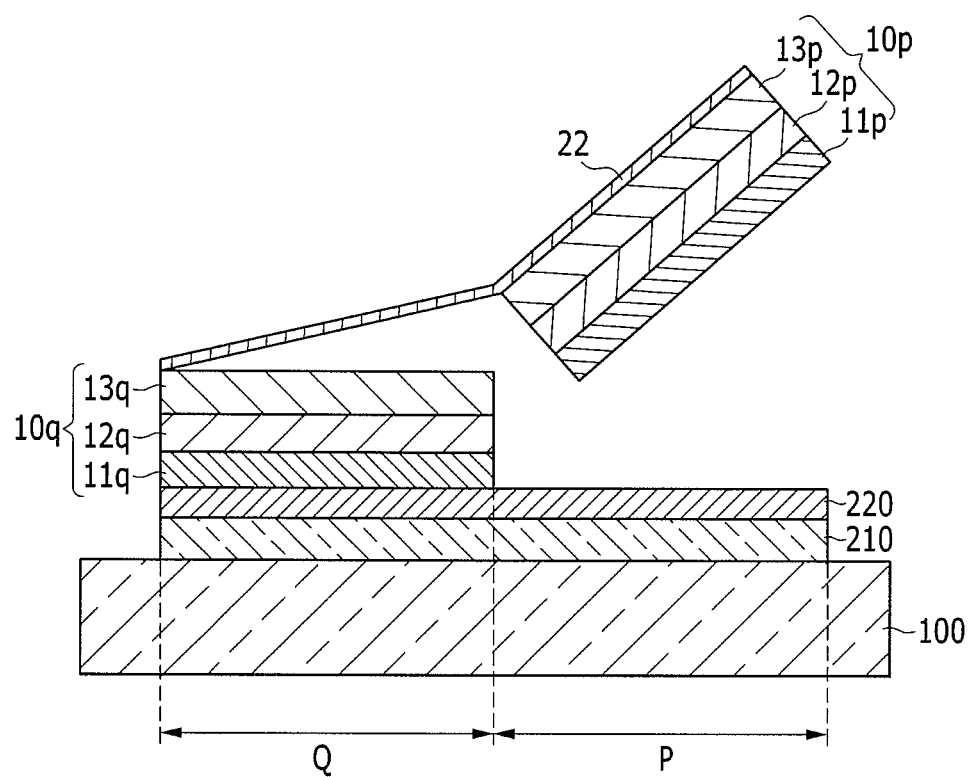

Next, as shown in FIG. 4, the organic emission layer 210 and the thin film encapsulation layer 220 covering the organic emission layer 210 are disposed on the substrate 100 that includes the pixel area Q and the peripheral area P (see FIG. 6). In addition, the lower protective layer 21 is peeled from the laminating film 30 (see FIG. 3) to expose the lower adhesive layer 11. Then, the lower adhesive layer 11 of the laminating film 30 is adhered to the thin film encapsulation layer 220.

Figure 5:
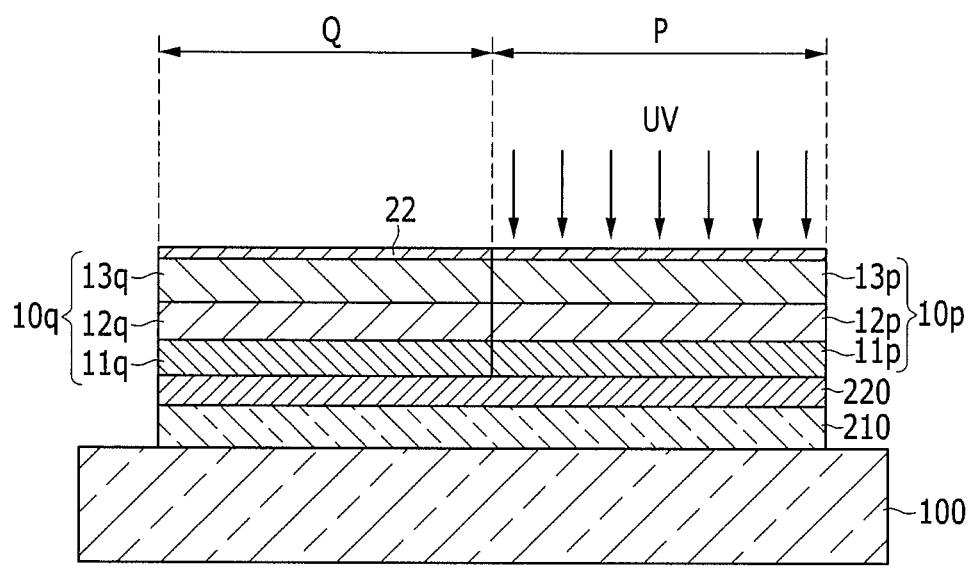

Next, as shown in FIG. 5, UV light is radiated to a peripheral laminating film 10p that corresponds to the peripheral area P of the substrate 100 to change the adhesive force of peripheral adhesive layers 11p, 12p, and 13p. The peripheral adhesive layers include lower peripheral adhesive layer 11p, middle peripheral adhesive layer 12p, and upper peripheral adhesive layer 13p.

Figure 7:
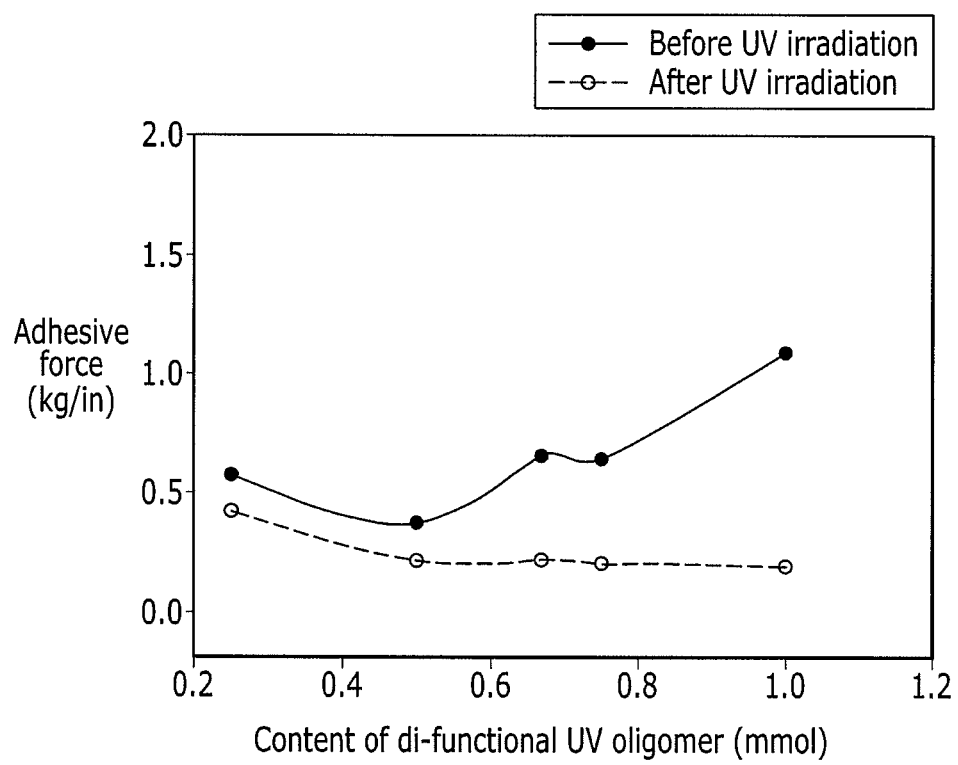
FIG. 7 is a graph illustrating change of an adhesive force according to the concentration of a di-functional ultraviolet (UV) oligomer before and after UV light irradiation.
Figure 8:
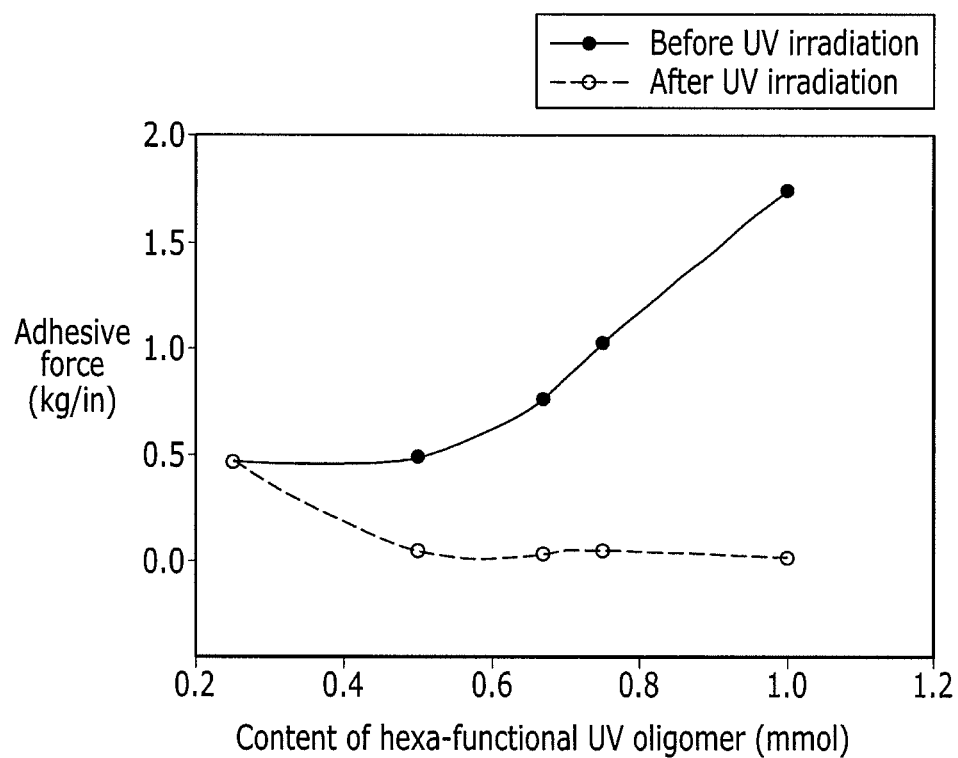
FIG. 8 is a graph illustrating change of an adhesive force according to the concentration of a hexa-functional UV oligomer before and after UV light irradiation.

FIG. 7 is a graph illustrating the change of the adhesive force according to the concentration of the di-functional UV oligomer before and after UV light irradiation. FIG. 8 is a graph illustrating the change of the adhesive force according to the concentration of hexa-functional UV oligomer before and after UV light irradiation.

As shown in FIGS. 7-8, the adhesive force of the di-functional UV oligomer is increased relative to that of the hexa-functional UV oligomer after UV light irradiation. Accordingly, the adhesive force of an adhesive layer is decreased after UV light irradiation as the concentration of the di-functional UV oligomer is decreased relative to the concentration of the hexa-functional UV oligomer.

Thus, since the UV-irradiated lower peripheral adhesive layer 11p contains less of the di-functional UV oligomer than the UV-irradiated upper peripheral adhesive layer 13p, the adhesive force of the lower peripheral adhesive layer 11p becomes weaker than that of the upper peripheral adhesive layer 13p. Accordingly, adhesion between the lower peripheral adhesive layer 11p of the laminating film 30 and the thin film encapsulation layer 220 is decreased.

Further, when the sum of the di-functional UV oligomer concentration and the hexa-functional UV oligomer concentration of the upper peripheral adhesive layer 13p is less than that of the lower peripheral adhesive layer 11p, it follows that the lower peripheral adhesive layer 11p has a significantly higher concentration of the hexa-functional UV oligomer than the upper peripheral adhesive layer 13p. Accordingly, the adhesion between the lower peripheral adhesive layer 11p of the laminating film 30 and the thin film encapsulation layer 220 is further decreased after UV light irradiation.

Next, as shown in FIG. 6, the peripheral laminating film 10p is peeled from the thin film encapsulation layer 220 and the pixel laminating film 10q remains. In this case, since the adhesion between the lower peripheral adhesive layer 11p of the peripheral laminating film 10p and the thin film encapsulation layer 220 is decreased, the lower peripheral adhesive layer 11p of the peripheral laminating film 10p can be easily peeled from the thin film encapsulation layer 220.

Further, the adhesive force of the upper peripheral adhesive layer 13p is stronger than that of the lower peripheral adhesive layer 11p, and therefore the upper peripheral adhesive layer 13p and the upper protective layer 22 remain adhered to each other. In addition, the upper protective layer 22 at a location corresponding to the pixel area Q of the substrate 100 is peeled from the upper pixel adhesive layer 13q while the peripheral laminating film 10p is peeled from the thin film encapsulation layer 220 at the same time.

Finally, the pixel laminating film 10q corresponding to the pixel area Q of the substrate 100 is cured.

As described, the di-functional UV oligomer concentration of the upper adhesive layer 13 of the laminating film 30 is larger than that of the lower adhesive layer 11, the sum of the di-functional UV oligomer concentration and the hexa-functional UV oligomer concentration of the upper adhesive layer 13 is less than that of the lower adhesive layer 11, and the adhesive force of the lower peripheral adhesive layer 11p disposed in the peripheral area P is weakened by the UV irradiation. Consequently, the pixel laminating film 10q can be patterned by easily peeling the lower peripheral adhesive layer 11p from the thin film encapsulation layer 220.

Accordingly, when the OLED display model is changed, the pattern of the pixel laminating film 10q can be easily changed using the peeling process of the peripheral laminating film 10p. Further, the process time and the process cost can be reduced because an additional cutting device or press device is not required.

It should be noted that in the first exemplary embodiment (illustrated in FIGS. 1-6), only the laminating film is patterned. In other embodiments, the laminating film 30 and the thin film encapsulation layer 220 may be simultaneously patterned. Hereinafter, an OLED display according to a second exemplary embodiment will be described in further detail with reference to FIG. 9.

Figure 9:
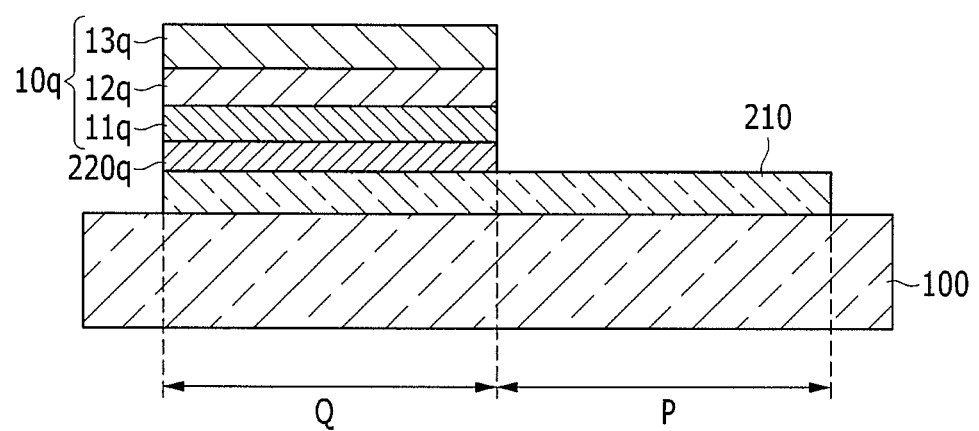
FIG. 9 is a cross-sectional view of an OLED display according to a second exemplary embodiment.

FIG. 9 is a cross-sectional view of the OLED display according to the second exemplary embodiment.

The second exemplary embodiment is substantially the same as the first exemplary embodiment shown in FIG. 2 except that a thin film encapsulation layer is patterned, such that repeated description will not be provided.

As shown in FIG. 9, an organic emission layer 210 is disposed on a substrate 100 including a pixel area Q and a peripheral area P. A pixel thin film encapsulation layer 220q encapsulates the organic emission layer 210 by covering the same. The pixel thin film encapsulation layer 220q is disposed in the pixel area Q, and contains a di-functional UV oligomer and a hexa-functional UV oligomer.

A pixel laminating film 10q is disposed on the pixel thin film encapsulation layer 220q. The pixel laminating film 10q includes a plurality of pixel adhesive layers 11q, 12q, and 13q, each of which may contain an acryl-based adhesive, a di-functional UV oligomer, and a hexa-functional UV oligomer. The plurality of pixel adhesive layers 11q, 12q, and 13q are cured such that they protect the OLED display from the external environment. The number of pixel adhesive layers in the pixel laminating film 10q is not limited to three. In other embodiments, one or more pixel adhesive layers may be used.

The plurality of pixel adhesive layers 11q, 12q, and 13q include a lower pixel adhesive layer 11q, a middle pixel adhesive layer 12q, and an upper pixel adhesive layer 13q. The upper pixel adhesive layer 13q and the pixel thin film encapsulation layer 220q are different from each other in the concentration of the di-functional UV oligomer and the concentration of the hexa-functional UV oligomer. That is, the di-functional UV oligomer concentration of the upper pixel adhesive layer 13q is larger than that of the pixel thin film encapsulation layer 220q, and the sum of the di-functional UV oligomer concentration and the hexa-functional UV oligomer concentration of the upper pixel adhesive layer 13q is less than that of the pixel thin film encapsulation layer 220q. The same relationship may exist with the other pixel adhesive layers (for example, the lower pixel adhesive layer 11q and the middle pixel adhesive layer 12q) and the pixel thin film encapsulation layer 220q.

Here, the di-functional UV oligomer has a stronger adhesive force than the hexa-functional UV oligomer. Further, the adhesive force is increased as the sum of the di-functional UV oligomer concentration and the hexa-functional UV oligomer concentration is decreased.

Thus, when UV light is radiated to a peripheral laminating film 10p (refer to FIG. 10) and a peripheral thin film encapsulation layer 220p (refer to FIG. 10) disposed in the peripheral area P to manufacture the OLED display of FIG. 9, the adhesive force of the peripheral thin film encapsulation layer 220p that contains much more of the hexa-functional UV oligomer than the di-functional UV oligomer (relative to those of the upper peripheral adhesive layer 13p) is weakened because the adhesive force of the hexa-functional UV oligomer is weakened more than that of the di-functional UV oligomer after the UV light irradiation. Accordingly, the peripheral thin film encapsulation layer 220p disposed in the peripheral area P can be easily peeled from the organic emission layer 210.

A manufacturing method of the OLED display according to the second exemplary embodiment will now be described in further detail with reference to FIGS. 10-11.

Figure 10:
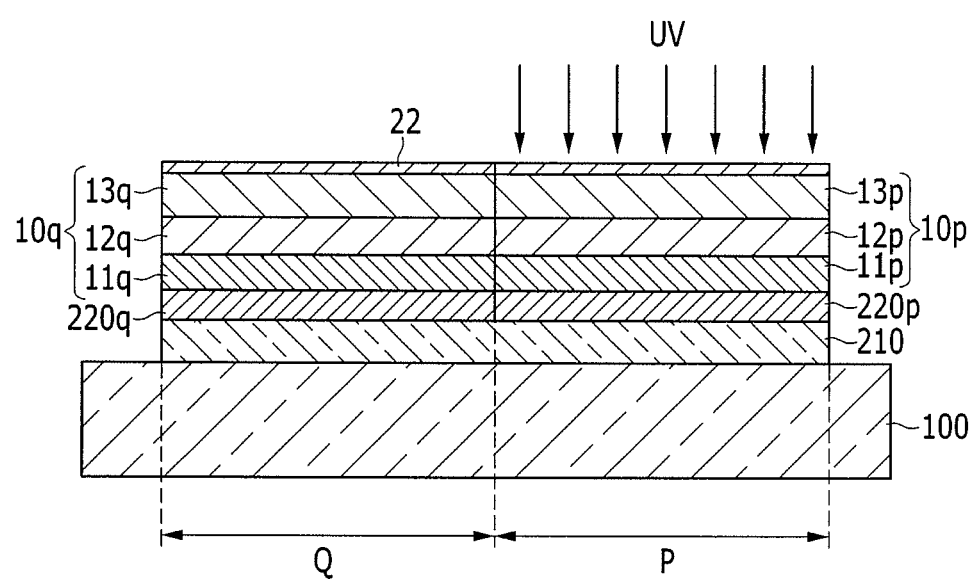
FIGS. 10-11 are cross-sectional views of a manufacturing method of the OLED display of FIG. 9.
Figure 11:
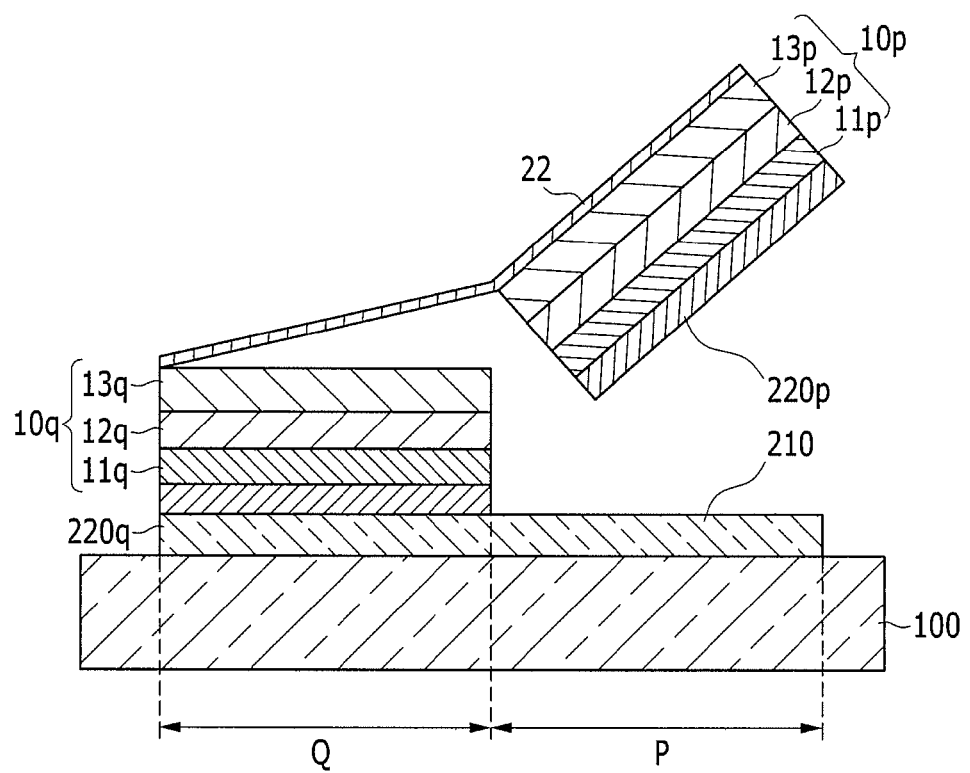

FIGS. 10-11 are cross-sectional views of the manufacturing method of the OLED display of FIG. 9.

First, as shown in FIG. 10, the organic emission layer 210 and the thin film encapsulation layers 220p and 220q covering the organic emission layer 210 are disposed on the substrate 100 including the pixel area Q and the peripheral area P. Referring back to FIG. 3, a lower protective layer 21 is peeled off a laminating film 30 and a lower adhesive layer 11 is exposed. Then, the lower adhesive layer 11 of the laminating film 30 is adhered to the thin film encapsulation layers 220p and 220q. In this case, the thin film encapsulation layers 220p and 220q each contain a di-functional UV oligomer and a hexa-functional UV oligomer.

In addition, the adhesive force of the peripheral adhesive layers 11p, 12p, and 13p, and the adhesive force of the peripheral thin film encapsulation layer 220p are changed by radiating UV light on the peripheral laminating film 10p and the peripheral thin film encapsulation layer 220p that correspond to the peripheral area P of the substrate 100.

Since the UV-irradiated peripheral thin film encapsulation layer 220p contains less of the di-functional UV oligomer than the UV-irradiated upper peripheral adhesive layer 13p, the adhesive force of the peripheral thin film encapsulation layer 220p becomes weaker than that of the upper peripheral adhesive layer 13p. Accordingly, adhesion between the peripheral thin film encapsulation layer 220p and the organic emission layer 210 is decreased. In addition, since the sum of the di-functional UV oligomer concentration and the hexa-functional UV oligomer concentration of the upper peripheral adhesive layer 13p is less than that of the peripheral thin film encapsulation layer 220p, the adhesion between the peripheral thin film encapsulation layer 220p and the organic emission layer 210 is further decreased.

Next, as shown in FIG. 11, the peripheral laminating film 10p and the peripheral thin film encapsulation layer 220p are peeled from the organic emission layer 210 and the pixel laminating film 10q and the pixel thin film encapsulation layer 220q remain. In this case, since the adhesion between the peripheral thin film encapsulation layer 220p and the organic emission layer 210 is decreased, the peripheral thin film encapsulation layer 220p can be easily peeled from the organic emission layer 210.

Further, the adhesive force of the upper peripheral adhesive layer 13p is stronger than that of the peripheral thin film encapsulation layer 220p. Accordingly, the upper peripheral adhesive layer 13p and the upper protective layer 22 remain adhered to each other. In addition, the upper protective layer 22 at a location corresponding to the pixel area Q of the substrate 100 is peeled from the upper pixel adhesive layer 13q concurrently with the peeling of the peripheral laminating film 10p and the peripheral thin film encapsulation layer 220p from the organic emission layer 210.

Finally, the pixel laminating film 10q that corresponds to the pixel area Q of the substrate 100 is cured.

As described, (1) the di-functional UV oligomer concentration of the upper adhesive layer 13 of the laminating film 30 is larger than that of the thin film encapsulation layers 220p and 220q, (2) the sum of the di-functional UV oligomer concentration and the hexa-functional UV oligomer concentration of the upper adhesive layer 13 is less than that of the thin film encapsulation layers 220p and 220q, and (3) the adhesive force of the peripheral thin film encapsulation layer 220 disposed in the peripheral area P is weakened by the UV light irradiation. Accordingly, the pixel laminating film 10q and the pixel thin film encapsulation layer 220q can be concurrently (for example, simultaneously or concurrently) patterned by easily peeling the peripheral thin film encapsulation layer 220p from the organic emission layer 210.

Accordingly, as described, process time and manufacturing cost can be reduced by simultaneously patterning the laminating film 30 and the thin film encapsulation layers 220p and 220q. Further, an additional cutting device or press device is not required for patterning of the laminating film 30 and the thin film encapsulation layers 220p and 220q, so that the process time can be shortened and the process cost can be reduced.

While the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

Description of Selected Symbols

| | |
|---|---|
| 10p: peripheral laminating film | 10q: pixel laminating film |
| 11p: lower peripheral adhesive layer | 11q: lower pixel adhesive layer |
| 13p: upper peripheral adhesive layer | 13q: upper pixel adhesive layer |
| 210: organic emission layer | 220: thin film encapsulation layer |
| 220p: peripheral thin film encapsulation layer | 220q: pixel thin film encapsulation layer |

What is claimed is:

1. An organic light emitting diode (OLED) display comprising:
    an organic emission layer on a substrate including a pixel area and a peripheral area;
    a thin film encapsulation layer covering the organic emission layer corresponding to the pixel area of the substrate; and
    a pixel laminating film covering the thin film encapsulation layer corresponding to the pixel area of the substrate, and including one or more pixel adhesive layers that each comprise an acryl-based adhesive, a di-functional ultraviolet (UV) oligomer, and a hexa-functional UV oligomer, wherein an upper pixel adhesive layer and a lower pixel adhesive layer from among the pixel adhesive layers have different di-functional UV oligomer concentrations and different hexa-functional UV oligomer concentrations.

2. The OLED display of claim 1, wherein a di-functional UV oligomer concentration of the upper pixel adhesive layer is larger than a di-functional UV oligomer concentration of the lower pixel adhesive layer.

3. The OLED display of claim 1, wherein a sum of the di-functional UV oligomer concentration and a hexa-functional UV oligomer concentration of the upper pixel adhesive layer is less than a sum of the di-functional UV oligomer concentration and a hexa-functional UV oligomer concentration of the lower pixel adhesive layer.

4. The OLED display of claim 1, wherein the thin film encapsulation layer corresponds to the pixel area of the substrate, and
    comprises the di-functional UV oligomer and the hexa-functional UV oligomer.

5. The OLED display of claim 4, wherein an upper pixel adhesive layer from among the pixel adhesive layers and the thin film encapsulation layer have different di-functional UV oligomer concentrations and different hexa-functional UV oligomer concentrations.

6. The OLED display of claim 5, wherein a di-functional UV oligomer concentration of the thin film encapsulation layer is less than a di-functional UV oligomer concentration of the upper pixel adhesive layer.

7. The OLED display of claim 5, wherein a sum of the di-functional UV oligomer concentration and a hexa-functional UV oligomer concentration of the thin film encapsulation layer is larger than a sum of the di-functional UV oligomer concentration and a hexa-functional UV oligomer concentration of the upper pixel adhesive layer.

8. A manufacturing method of an organic light emitting diode (OLED) display, comprising:
    forming an organic emission layer and a thin film encapsulation layer covering the organic emission layer on a substrate including a pixel area and a peripheral area;
    adhering a laminating film comprising a plurality of adhesive layers and an upper protective layer that covers an upper adhesive layer from among the plurality of adhesive layers on the thin film encapsulation layer, a lower adhesive layer from among the plurality of adhesive layers contacting the thin film encapsulation layer;

radiating ultraviolet (UV) light on the laminating film that corresponds to the peripheral area of the substrate to decrease adhesion between the lower adhesive layer and the thin film encapsulation layer corresponding to the peripheral area of the substrate; and peeling the laminating film corresponding to the peripheral area of the substrate from the thin film encapsulation layer to maintain the laminating film that corresponds to the pixel area of the substrate.

9. The manufacturing method of claim 8, wherein each of the plurality of adhesive layers contains an acryl-based adhesive, a di-functional UV oligomer, and a hexa-functional UV oligomer.

10. The manufacturing method of claim 9, wherein a di-functional UV oligomer concentration of the upper adhesive layer is larger than a di-functional UV oligomer concentration of the lower adhesive layer.

11. The manufacturing method of claim 10, wherein a sum of the di-functional UV oligomer concentration and a hexa-functional UV oligomer concentration of the upper adhesive layer is less than a sum of the di-functional UV oligomer concentration and a hexa-functional UV oligomer concentration of the lower adhesive layer.

12. The manufacturing method of claim 8, wherein the peeling of the laminating film corresponding to the peripheral area of the substrate comprises peeling the upper protective layer that corresponds to the pixel area of the substrate from the upper adhesive layer.

13. The manufacturing method of claim 8, further comprising curing the laminating film that corresponds to the pixel area of the substrate after the peeling of the laminating film corresponding to the peripheral area of the substrate.

14. A manufacturing method of an organic light emitting diode (OLED) display, comprising:

forming an organic emission layer and a thin film encapsulation layer that covers the organic emission layer and contains a di-functional ultraviolet (UV) oligomer and a hexa-functional UV oligomer on a substrate including a pixel area and a peripheral area;

adhering a laminating film comprising one or more adhesive layers and an upper protective layer covering an upper adhesive layer from among the adhesive layers on the thin film encapsulation layer;

radiating ultraviolet (UV) light on the laminating film and the thin film encapsulation layer that corresponds to the peripheral area of the substrate to decrease adhesion between the thin film encapsulation layer and the organic emission layer corresponding to the peripheral area of the substrate; and peeling the laminating film and the thin film encapsulation layer corresponding to the peripheral area of the substrate from the organic emission layer to maintain the laminating film and the thin film encapsulation layer corresponding to the pixel area of the substrate.

15. The manufacturing method of claim 14, wherein each of the adhesive layers contain an acryl-based adhesive, a di-functional UV oligomer, and a hexa-functional UV oligomer.

16. The manufacturing method of claim 15, wherein a di-functional UV oligomer concentration of the thin film encapsulation layer is less than a di-functional UV oligomer concentration of the upper adhesive layer.

17. The manufacturing method of claim 16, wherein a sum of the di-functional UV oligomer concentration and a hexa-functional UV oligomer concentration of the thin film encapsulation layer is larger than a sum of the di-functional UV oligomer concentration and a hexa-functional UV oligomer concentration of the upper adhesive layer.

18. The manufacturing method of claim 14, wherein the peeling of the laminating film and the thin film encapsulation layer corresponding to the peripheral area of the substrate comprises peeling the upper protective layer that corresponds to the pixel area of the substrate from the upper adhesive layer.

19. The manufacturing method of claim 14, further comprising curing the laminating film that corresponds to the pixel area of the substrate after the peeling of the laminating film and the thin film encapsulation layer corresponding to the peripheral area of the substrate.

* * * * *